United States Patent
Polinsky et al.

(10) Patent No.: US 6,762,125 B1
(45) Date of Patent: Jul. 13, 2004

(54) MODIFIED FACET ETCH TO PREVENT BLOWN GATE OXIDE AND INCREASE ETCH CHAMBER LIFE

(75) Inventors: William A. Polinsky, Boise, ID (US); Thomas S. Kari, Boise, ID (US); Mark A. Bossler, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 51 days.

(21) Appl. No.: 09/854,975

(22) Filed: May 14, 2001

(51) Int. Cl.$^7$ ............... H01L 21/302; H01L 21/3065; H01L 21/311
(52) U.S. Cl. ............... 438/694; 438/706; 438/710; 438/712; 438/723; 216/67
(58) Field of Search ............... 438/694, 706, 438/710, 712, 723; 216/67

(56) References Cited

U.S. PATENT DOCUMENTS

| | | | |
|---|---|---|---|
| 4,698,128 A | 10/1987 | Berglund et al. | 156/643 |
| 5,203,957 A | 4/1993 | Yoo et al. | 156/643 |
| 5,346,585 A | 9/1994 | Doan et al. | 156/643 |
| 5,416,048 A | 5/1995 | Blalock et al. | 437/228 |
| 5,658,818 A | 8/1997 | Akram et al. | 437/60 |
| 5,744,196 A | * 4/1998 | Laxman et al. | 427/255.3 |
| 5,814,564 A | * 9/1998 | Yao et al. | 438/723 |
| 5,935,875 A | * 8/1999 | Lee | 438/733 |
| 5,985,767 A | 11/1999 | Roberts et al. | 438/720 |
| 5,997,699 A | 12/1999 | Leiphart | 204/192.3 |
| 6,069,398 A | 5/2000 | Kadosh et al. | 257/538 |
| 6,136,695 A | 10/2000 | Lee et al. | 438/637 |
| 6,143,649 A | 11/2000 | Tang | 438/640 |
| 6,177,802 B1 | 1/2001 | Shabde et al. | 324/537 |
| 6,191,050 B1 | 2/2001 | Andideh | 438/759 |

* cited by examiner

Primary Examiner—Nadine G. Norton
Assistant Examiner—Lynette T. Umez-Eronini
(74) Attorney, Agent, or Firm—Whyte Hirschboeck Dudek SC

(57) ABSTRACT

A modified facet is disclosed to prevent blown gate oxide and increase etch chamber life. The modified facet etch is a two-stage process. The first stage is a plasma sputter etch to form a facet profile. The first stage etch is terminated prior to reaching the target depth for the etching process. The second stage etch is a reactive ion etch which directionally follows the facet profile to reach the target depth.

21 Claims, 2 Drawing Sheets

MODIFIED FACET ETCH TO PREVENT BLOWN GATE OXIDE AND INCREASE ETCH CHAMBER LIFE

FIELD OF THE INVENTION

This invention relates to semiconductor manufacture, and more particularly to facet etching useful for improving subsequent dielectric layer step coverage.

BACKGROUND OF THE INVENTION

A major goal of any dielectric deposition system is good step coverage. Step coverage refers to the ability of subsequent layers to evenly cover layers ("steps") already present on the substrate. Facet etches are frequently used to provide superior step coverage. The standard facet etch uses a high energy argon ion which physically bombards the material being etched and thereby etches the oxide at an angle to allow subsequent material to have the best step coverage possible. However, if the argon ions etch through the oxide and reach metal or another conductor, they disperse their energy into the metal line or other conductor. This energy finds its way to a ground through a weak spot in the gate oxide thereby resulting in a blown gate.

In sputter etching, ions which impinge on horizontal surfaces have a minimal effect on etch rate and profile. However, the sputter yield of the etch at the corners is approximately four times that of the etch rate of a horizontal surface, thereby creating an extreme etch profile. The effect is the wearing away of the corners of a feature at approximately 45 degree angles. The material removed by the sputter etch is redeposited along the sides of the feature and along the surface of the substrate.

An issue associated with sputter etching is that some of the sputtered material redeposits frequently on the inside surfaces of the etching chamber. This redeposited material must be removed at intervals, thereby taking the etching chamber off-line.

SUMMARY OF THE INVENTION

The process of the present invention employs a two-step etching sequence wherein an insulating layer deposited on top of a plurality of conductive structures is first etched by a high energy inert gas ion to physically sputter the oxide material and form a faceted etch. The first step etch is terminated prior to reaching a predetermined target depth. The second step etch is conducted with a reactant gas to further remove the insulating material down to the target depth.

In a preferred embodiment, the method of the invention comprises forming a first layer comprising an insulating material superjacent a substrate comprising a plurality of conductive structures, at least some of the conductive structures being placed apart to form spaces between the conductive structures, such that the first layer forms in at least some of the spaces between the conductive structures and the first layer is formed to a thickness at least equal to the target depth. Next, the first layer is etched by directing a plasma of an inert gas at the first layer formed in at least some of the spaces between the conductive structures. The plasma is of sufficient energy to sputter material from the first layer thereby forming a facet etch in the first layer formed in the spaces between the conductive structures. The first etch is terminated when the first layer has been etched to a predetermined depth which is less than the target depth.

Next, the first layer is etched, in a second etch, by contacting the first layer with a reactive chemical gas/plasma. The second etch is terminated when the first layer has been etched to the target depth.

Various other features, objects and advantages of the present invention will be made apparent from the following detailed description and the drawings.

BRIEF DESCRIPTION OF THE DRAWINGS

Preferred embodiments of the invention are described below with reference to the following accompanying drawings, which are for illustrative purposes only. Throughout the following views, reference numerals will be used in the drawings, and the same reference numerals will be used throughout the several views and in the description to indicate same or like parts.

DETAILED DESCRIPTION OF THE INVENTION

In the following detailed description, references made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention.

Figure 1:
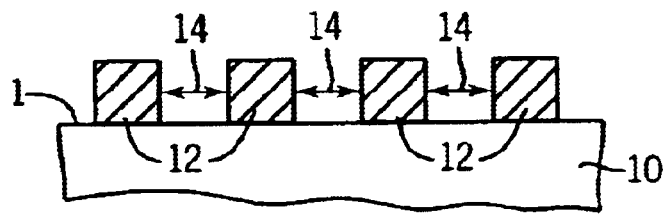
FIG. 1 is a schematic view of a semiconductor device having a plurality of conductive structures.

FIG. 1 shows a semiconductor device 1 suitable for use in a preferred embodiment of this invention. The semiconductor device 1 comprises a plurality of conductive structures 12 overlying a substrate 10. The conductive structures 12 are positioned in close proximity to each other to form spaces 14 between the conductive structures 12.

Conductive structures 12 can be any conductive element of semiconductor device 1 but are typically metal lines, runners, leads or interconnects. Conductive structures 12 typically comprise at least one of titanium, tungsten, tantalum, molybdenum, aluminum, copper, gold, silver, nitrides thereof and suicides thereof The substrate 10 includes any semiconductor-based structure having a silicon base. The base of substrate 10 is to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, previous process steps may have been used to form regions or junctions in the base semiconductor structure or foundation. Typically, the substrate 10 will comprise at least one layer of material deposited on top of the silicon base. In one preferred embodiment, the uppermost layer of material of substrate 10, which contacts conductive structures 12, will be a dielectric material such as silicon dioxide or boron phosphosilicate glass (BPSG).

Figure 2:
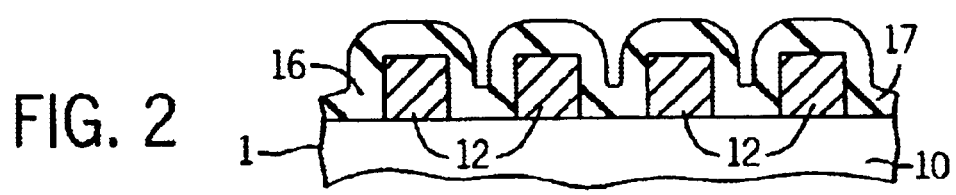
FIG. 2 is a schematic view of the semiconductor device of FIG. 1 at a later stage in the process.

A first layer 16 is formed over the substrate 10 and conductive structures 12 as shown in FIG. 2. First layer 16 comprises a dielectric material 17, preferably silicon dioxide or BPSG. First layer 16 may be conveniently formed by chemical vapor deposition or any other suitable means.

Figure 3:
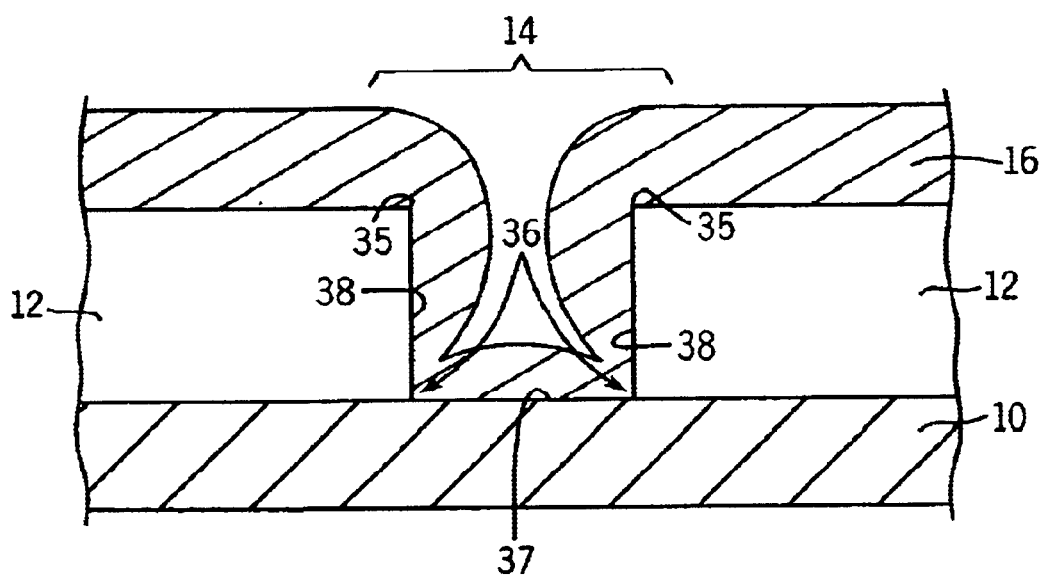
FIG. 3 shows a schematic view of a portion of the semiconductor device of FIG. 2.

As shown in FIG. 3, the spaces 14 between the conductive structures 12 are not completely or uniformly filled during the formation of first layer 16. In particular, the bottom 37 and lower corners 36 of space 14 are covered with a thinner depth of dielectric material 17 than are the sidewalls 38 and upper corners 35. This nonuniform coverage of dielectric material 17 leads to the formation of undesirable voids, known as keyholes within the first layer 10 or between the first layer 10 and subsequent layers.

Figure 4:
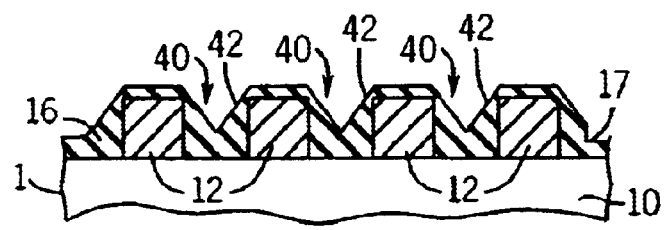
FIG. 4 shows the semiconductor device of FIG. 2 at a later stage in the process.

A facet etch is performed to provide a lower aspect opening for subsequent layers as shown in FIG. 4. The facet etch is conveniently performed by placing the semiconductor device 1 in a high vacuum reactor on a cathode for which a power source creates a radio frequency (RF) of 13.56 Mhz, while controlling the introduction of the etchant gases.

The walls of the reactor are grounded to allow for a return RF path. This chamber configuration is generally referred to as a Reactive Ion Etcher (R.I.E.). The RF power source acts to create a plasma condition within the chamber, thereby allowing for the creation of charged particles or ions 40.

Due to the physics of the RF powered electrode, a direct current self-bias voltage condition is created at the semiconductor device 1 location. This self-bias condition acts to direct the charged particles or ions 40 toward the semiconductor device 1 in a direction perpendicular to the device surface 1.

If the pressure is in a range being slightly less than 30 mtorr, the mean free path of the charged particles or ions 40 will be great enough to allow for physical sputtering of dielectric material 17 when the ions 40 impinge on the surface of the first layer 12. It is important to note that a wide variety of systems and parameters can be used to effect a facet etch, as long as the pressure limit is not violated. As the pressure nears and exceeds 30 mtorr, the results of the process are effected.

Typical parameters for facet etching using an Applied Materials 5000 Series equipment are as follows:

RF power: 300–700 watts pressure: 10–30 mtorr etchant: 30–70 sccm.

Figure 5:
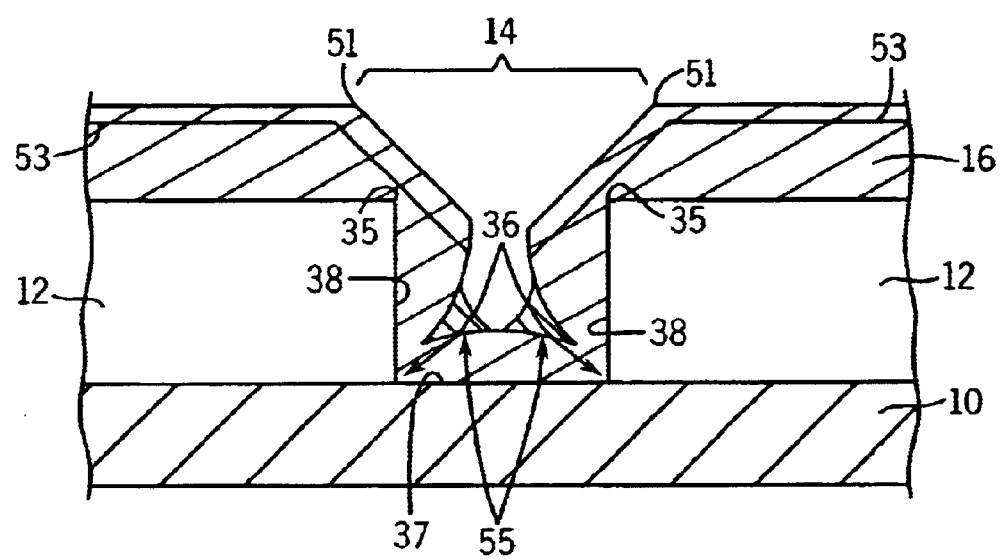
FIG. 5 shows a portion of the semiconductor device of FIG. 4.

The facet etch is performed for a time sufficient to obtain holes with sloping sides 42 in first layer 16 as shown in FIG. 4. The facet etch is terminated at depth 51 prior to removing the dielectric material 17 to a predetermined target depth 53 as shown in FIG. 5. The facet etch is terminated at a depth at least half of the target depth. For example, if the target depth is 300 Å, the facet etch will be at least 150 Å. Preferably, the facet etch is as deep as possible, as constrained by the possibility of etching through first layer 12, in order to allow the second etch to maintain the facet contour. Typically, the facet etch is terminated less than about 150 Å, preferably no more than about 100 Å, more preferably, nor more than about 50 Å prior to the target depth 53. Some of the sputtered dielectric material 17 redeposits 55 in bottom corners 36. Subsequent to the termination of the facet etch, a chemical reactive ion etch (RIE) is performed on first layer 16. The RIE is a directional etch which removes dielectric material 17 along the profile established by the facet etch. The RIE is terminated when sufficient dielectric material 17 is removed to reach the target depth 53. This two-stage etch therefore results in a profiled etch of the desired depth.

Figure 6:
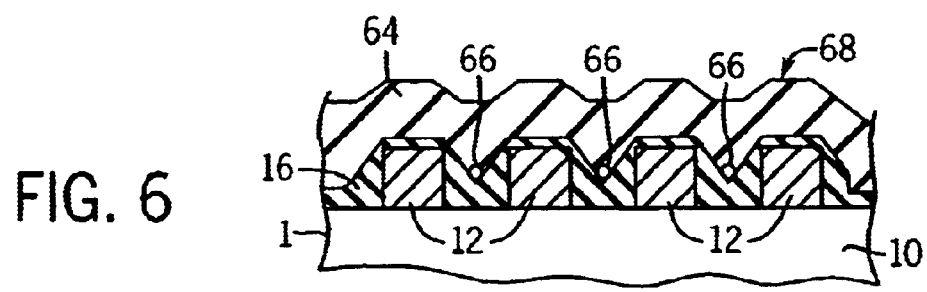
FIG. 6 shows the semiconductor device of FIG. 4 at a later stage of the process.

As shown in FIG. 6, a second layer 64 may then be formed over first layer 10 with the formation of only minimized keyholes 66. Additionally, the upper surface 68 of the second layer is relatively even.

As is typical with any sputter process, some of the sputtered dielectric material redeposits onto the interior surfaces of the etching chamber. The sputtered material which redeposits onto the chamber surfaces gradually builds up to a depth sufficient to impair the operation of the etching chamber. At that time, the etching chamber must be taken off-line for cleaning and reconditioning. An additional benefit to the current two-stage process is that the second stage reactive ion etch also etches the material building up on the chamber surfaces. As such, the etching chamber is at least partially cleaned on-line and the time between off-line cleaning and reconditioning is greatly extended.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended interpreted in accordance with the doctrine of equivalents.

What is claimed is:

1. A method for facet etching a semiconductor device to a target depth, the method comprising the steps of:

forming a first layer comprising an insulating material superjacent a substrate comprising a plurality of conductive structures, at least some of the conductive structures being placed apart to form spaces between the conductive structures, such that the first layer forms in at least some of the spaces between the conductive structures and the first layer is formed to a thickness at least equal to the target depth;

etching the first layer, in a first etch, by directing a plasma beam at the first layer formed in at least some of the spaces between the conductive structures, wherein the plasma is of sufficient energy to sputter material from the first layer and the plasma is an ion of an inert gas thereby forming a facet etch in the first layer formed in the spaces between the conductive structures;

terminating the first etch when the first layer has been etched to a predetermined depth which is less than the target depth;

etching the first layer, in a second etch, by contacting the first layer with a reactive chemical gas/plasma; and terminating the second etch when the first layer has been etched to the target depth.

2. The method of claim 1 wherein the first layer is formed by means of chemical vapor deposition.

3. The method of claim 1 wherein the first layer comprises silicon dioxide or boron phosphosilicate glass.

4. The method of claim 1 wherein the conductive structures form at least one of metal lines, interconnects and leads.

5. The method of claim 4 wherein the conductive structures comprise at least one of titanium, tungsten, tantalum, molybdenum, aluminum, copper, gold, silver, nitrides thereof and suicides thereof.

6. The method of claim 1 wherein the inert gas is at least one of helium, argon, xenon, krypton.

7. The method of claim 1 wherein the plasma has an energy of about 300 to about 700 W.

8. The method of claim 1, wherein the first etch is terminated at a depth no more than about 150 Å less than the target depth.

9. The method of claim 1, wherein the first etch is terminated at a depth no more than about 100 Å less than the target depth.

10. The method of claim 1 wherein the first etch is terminated at a depth about 50 Å less than the target depth.

11. A method for improving dielectric step coverage, the method comprising the following steps:

forming a first layer comprising an insulating material superjacent a substrate comprising a plurality of conductive structures, at least some of the conductive structures being placed apart to form spaces between the conductive structures, such that the first layer forms in at least some of the spaces between the conductive structures and the first layer is formed to a thickness at least equal to the target depth;

etching the first layer, in a first etch, by directing a plasma at the first layer formed in at least some of the spaces between the conductive structures, wherein the plasma is of sufficient energy to sputter material from the first layer and the plasma is an ion of an inert gas thereby forming a facet etch in the first layer formed in the spaces between the conductive structures;

terminating the first etch when the first layer has been etched to a predetermined depth which is less than the target depth;

etching the first layer, in a second etch, by contacting the first layer with a reactive chemical gas/plasma;

terminating the second etch when the first layer has been etched to the target depth, and forming a second layer comprising an insulating material superjacent the first layer.

12. The method of claim 11 wherein the second layer uniformly covers the first layer.

13. The method of claim 11 wherein the first layer is formed by means of chemical vapor deposition.

14. The method of claim 11 wherein the first layer comprises silicon dioxide or boron phosphosilicate glass.

15. The method of claim 11 wherein the conductive structures form at least one of metal lines, runners, interconnects and leads.

16. The method of claim 15 wherein the conductive structures comprise at least one of titanium, tungsten, tantalum, molybdenum, aluminum, copper, gold, silver, nitrides thereof and silicides thereof.

17. The method of claim 11 wherein the inert gas is at least one of helium, argon, xenon, krypton.

18. The method of claim 11 wherein the plasma has an energy of about 300 to about 700 W.

19. The method of claim 11 wherein the first etch is terminated at a depth no more than 150 Å less than the target depth.

20. The method of claim 11 wherein the first etch is terminated at a depth no more than 100 Å less than the target depth.

21. The method of claim 11 wherein the first etch is terminated at a depth about 50 Å less than the target depth.

* * * * *

UNITED STATES PATENT AND TRADEMARK OFFICE
CERTIFICATE OF CORRECTION

PATENT NO. : 6,762,125 B1
DATED : July 13, 2004
INVENTOR(S) : William A. Polinsky et al.

It is certified that error appears in the above-identified patent and that said Letters Patent is hereby corrected as shown below:

Column 2,
Line 56, replace "suicides" with -- silicides --.

Column 3,
Lines 12 and 14, replace "comers" with -- corners --.

Column 4,
Line 29, add -- claims appropriately -- after "appended".

Signed and Sealed this

Fourteenth Day of December, 2004

JON W. DUDAS
*Director of the United States Patent and Trademark Office*